(12) United States Patent
Zheng (10) Patent No.: US 8,410,468 B2
(45) Date of Patent: Apr. 2, 2013

(54) HOLLOW GST STRUCTURE WITH DIELECTRIC FILL

(75) Inventor: Jun-Fei Zheng, Westport, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 284 days.

(21) Appl. No.: 12/824,749

(22) Filed: Jun. 28, 2010

(65) Prior Publication Data

US 2011/0001107 A1    Jan. 6, 2011

Related U.S. Application Data

(60) Provisional application No. 61/222,635, filed on Jul. 2, 2009.

(51) Int. Cl.
*H01L 29/02* (2006.01)

(52) U.S. Cl. .. 257/2; 257/3; 257/4; 257/5; 257/E29.002; 438/102; 438/103; 438/104

(58) Field of Classification Search .................. 257/2–5, 257/E29.002; 438/102–104
See application file for complete search history.

(56) References Cited

U.S. PATENT DOCUMENTS

| | | |
|---|---|---|
| 5,442,200 A | 8/1995 | Tischler |
| 5,566,045 A | 10/1996 | Summerfelt et al. |
| 5,576,928 A | 11/1996 | Summerfelt et al. |
| 5,596,522 A | 1/1997 | Ovshinsky et al. |
| 5,719,417 A | 2/1998 | Roeder et al. |
| 5,980,265 A | 11/1999 | Tischler |
| 5,998,236 A | 12/1999 | Roeder et al. |
| 6,005,127 A | 12/1999 | Todd et al. |
| 6,133,051 A | 10/2000 | Hintermaier et al. |
| 6,146,608 A | 11/2000 | Todd et al. |
| 6,319,565 B1 | 11/2001 | Todd et al. |
| 6,716,271 B1 | 4/2004 | Arno et al. |
| 6,750,079 B2 | 6/2004 | Lowrey et al. |

(Continued)

FOREIGN PATENT DOCUMENTS

| | | |
|---|---|---|
| EP | 1675194 A2 | 6/2006 |
| EP | 1710807 B1 | 11/2008 |

(Continued)

OTHER PUBLICATIONS

Cheng, H., et al., "Wet Etching of GE2SB2TE5 Films and Switching Properties of Resultant Phase Change Memory Cells", "Semiconductor Science and Technology", Sep. 26, 2005, pp. 1111-1115, vol. 20, No. 11.

(Continued)

*Primary Examiner* — Jami M Valentine
(74) *Attorney, Agent, or Firm* — Hultquist, PLLC; Steven J. Hultquist; Maggie Chappuis (57) ABSTRACT

A memory cell structure, including a substrate having a via therein bound at first and second ends thereof by electrodes. The via is coated on side surfaces thereof with GST material defining a core that is hollow or at least partially filled with material, e.g., germanium or dielectric material. One or more of such memory cell structures may be integrated in a phase change memory device. The memory cell structure can be fabricated in a substrate containing a via closed at one end thereof with a bottom electrode, by conformally coating GST material on sidewall surface of the via and surface of the bottom electrode enclosing the via, to form an open core volume bounded by the GST material, optionally at least partially filling the open core volume with germanium or dielectric material, annealing the GST material film, and forming a top electrode at an upper portion of the via.

27 Claims, 4 Drawing Sheets

U.S. PATENT DOCUMENTS

| | | | |
|---|---|---|---|
| 6,872,963 B2 | 3/2005 | Kostylev et al. | |
| 6,998,289 B2 | 2/2006 | Hudgens et al. | |
| 7,029,978 B2 | 4/2006 | Dodge | |
| 7,115,927 B2 | 10/2006 | Hideki et al. | |
| 7,312,165 B2 | 12/2007 | Jursich et al. | |
| 7,332,735 B2 | 2/2008 | Campbell | |
| 7,371,429 B2 | 5/2008 | Lee et al. | |
| 7,397,060 B2 * | 7/2008 | Lung | 257/2 |
| 7,402,851 B2 | 7/2008 | Hideki et al. | |
| 7,425,735 B2 | 9/2008 | Park et al. | |
| 7,439,536 B2 | 10/2008 | Pellizzer et al. | |
| 7,462,900 B2 | 12/2008 | Hideki et al. | |
| 7,473,921 B2 | 1/2009 | Lam et al. | |
| 7,476,917 B2 | 1/2009 | Hideki et al. | |
| 7,569,417 B2 | 8/2009 | Lee et al. | |
| 7,615,401 B2 | 11/2009 | Park et al. | |
| 7,615,439 B1 | 11/2009 | Schricker et al. | |
| 7,704,787 B2 | 4/2010 | Hideki et al. | |
| 7,728,172 B2 | 6/2010 | Lee et al. | |
| 7,732,801 B2 | 6/2010 | Chen | |
| 7,851,253 B2 | 12/2010 | Chen | |
| 7,935,564 B2 | 5/2011 | Breitwisch et al. | |
| 7,935,594 B2 | 5/2011 | Schricker et al. | |
| 7,943,923 B2 | 5/2011 | Gidon | |
| 7,969,011 B2 | 6/2011 | Sekar et al. | |
| 7,989,795 B2 | 8/2011 | Chen et al. | |
| 7,989,796 B2 | 8/2011 | Lam et al. | |
| 2004/0012009 A1 | 1/2004 | Casagrande et al. | |
| 2004/0197945 A1 | 10/2004 | Woelk et al. | |
| 2005/0082624 A1 | 4/2005 | Gousev et al. | |
| 2005/0287747 A1 | 12/2005 | Chakravarti et al. | |
| 2006/0035462 A1 | 2/2006 | Millward | |
| 2006/0049447 A1 | 3/2006 | Lee et al. | |
| 2006/0138393 A1 | 6/2006 | Seo et al. | |
| 2006/0172083 A1 | 8/2006 | Lee et al. | |
| 2006/0249369 A1 | 11/2006 | Marangon et al. | |
| 2007/0090336 A1 * | 4/2007 | Asano et al. | 257/3 |
| 2007/0121363 A1 | 5/2007 | Lung | |
| 2007/0160760 A1 | 7/2007 | Shin et al. | |
| 2007/0246748 A1 * | 10/2007 | Breitwisch et al. | 257/246 |
| 2008/0035906 A1 | 2/2008 | Park et al. | |
| 2008/0035961 A1 | 2/2008 | Chen et al. | |
| 2008/0078984 A1 | 4/2008 | Park et al. | |
| 2008/0191187 A1 | 8/2008 | Lung et al. | |
| 2008/0210163 A1 | 9/2008 | Carlson et al. | |
| 2008/0265236 A1 | 10/2008 | Lee et al. | |
| 2008/0272355 A1 | 11/2008 | Cho et al. | |
| 2008/0290335 A1 | 11/2008 | Lin et al. | |
| 2009/0020738 A1 * | 1/2009 | Happ et al. | 257/2 |
| 2009/0087561 A1 | 4/2009 | Chen et al. | |
| 2009/0101883 A1 * | 4/2009 | Lai et al. | 257/3 |
| 2009/0112009 A1 | 4/2009 | Chen et al. | |
| 2009/0124039 A1 | 5/2009 | Roeder et al. | |
| 2009/0215225 A1 | 8/2009 | Stender et al. | |
| 2009/0227066 A1 | 9/2009 | Joseph et al. | |
| 2009/0275164 A1 | 11/2009 | Chen et al. | |
| 2009/0291208 A1 | 11/2009 | Gordon et al. | |
| 2009/0305458 A1 | 12/2009 | Hunks et al. | |
| 2010/0096610 A1 | 4/2010 | Wang et al. | |
| 2010/0112795 A1 | 5/2010 | Kaim et al. | |
| 2010/0164057 A1 | 7/2010 | Hunks et al. | |
| 2010/0190341 A1 | 7/2010 | Park et al. | |
| 2010/0243981 A1 | 9/2010 | Kang et al. | |
| 2010/0264396 A1 | 10/2010 | Lung et al. | |
| 2010/0270527 A1 * | 10/2010 | Sawamura | 257/2 |
| 2011/0124182 A1 | 5/2011 | Zheng | |

FOREIGN PATENT DOCUMENTS

| | | |
|---|---|---|
| JP | 5-311423 A | 11/1993 |
| JP | 2001-067720 A | 3/2001 |
| JP | 2002-220658 A | 8/2002 |
| JP | 2008-252088 A | 10/2008 |
| KR | 1020050048891 A | 5/2005 |
| KR | 10-2006-0001089 A | 1/2006 |
| KR | 1020060091160 A | 8/2006 |
| KR | 1020070025612 A | 3/2007 |
| KR | 10-2008-0052362 A | 6/2008 |
| KR | 1020090008799 A | 1/2009 |
| KR | 10-2009-0036771 A | 4/2009 |
| KR | 10-1067969 B1 | 9/2011 |
| WO | 2007126690 A2 | 11/2007 |
| WO | 2009034775 A1 | 3/2009 |
| WO | 2011002705 A2 | 1/2011 |

OTHER PUBLICATIONS

Auner, N., et al "Organosilicon Chemistry IV: From Molecules to Materials ", Mar. 2000, p. 291, Publisher: Wiley-Vch.

Abrutis, A., et al., "Hot-Wire Chemical Vapor Deposition of Chalcogenide Materials for Phase Change Memory Applications", "Chem. Mater.", 2008, pp. 3557-3559, vol. 20.

U.S. Appl. No. 61/180,518, filed May 22, 2009.

Lee, J. et al., "GeSbTe deposition for the PRAM application", "Applied Surface Science", Feb. 1, 2007, pp. 3969-3976, vol. 253, Publisher: Elsevier.

Meller, A., et al., "Synthesis and Isolation of New Germanium (II) Compounds and of Free Germylenes", 1984, pp. 2020-2029, vol. 118 (English Abstract).

* cited by examiner

HOLLOW GST STRUCTURE WITH DIELECTRIC FILL

CROSS-REFERENCE TO RELATED APPLICATION

The benefit of priority of U.S. Provisional Patent Application 61/222,635 filed Jul. 2, 2009 in the name of Jun-Fei Zheng for "Hollow GST Structure with Dielectric Fill" is hereby claimed under the provisions of 35 USC 119. The disclosure of such U.S. Provisional patent application is hereby incorporated herein by reference, in its entirety, for all purposes.

FIELD

The present disclosure relates to phase change memory devices and, more particularly, to phase change memory devices incorporating germanium antimony telluride materials.

BACKGROUND

Phase change memory (PCM) is a type of non-volatile computer memory that utilizes differences in the electrical resistivity of the crystalline and amorphous phase states of memory materials. Devices that incorporate PCM typically comprise substrates on which a particular memory material (e.g., a chalcogenide) is deposited. The memory material is typically deposited within structures (such as holes, trenches, or the like) in or on the surfaces of the substrate. Patterned electrodes are also deposited on the substrate to allow for the conduction of current. The conduction of current is effected through the deposited memory material, with the level of current being dependent on the resistivity and heating efficiency of such memory material and its alloy properties on phase change.

One memory material used in the manufacture of PCM devices is germanium antimony telluride (GST). The GST materials can function in principle very effectively as phase change material for a volume, v, having characteristic dimensions as small as 5 nm. The trend is to make PCM devices based on GST with characteristic dimensions in the regime of 30 to 10 nm or less in future generations of devices. Also, to confine the heat for phase change, a hole structure with dielectric surrounding the hole is highly preferred, with the aspect ratio of the hole being greater than 1, typically greater than 3:1 to improve heating efficiency. The deposition of germanium antimony telluride by chemical vapor deposition (CVD) process(es) can be carried out to produce a CVD film of amorphous phase or limited crystallinity. The deposition of germanium antimony telluride is difficult to achieve because non-perfect conformality (<100%) or smooth surfaces will leave voids deep inside the hole. This is because GST is deposited faster on the upper portions of the wall of the hole. The hole as a result may be filled at the upper part of the hole and occluded from deposition on the lower surfaces in the hole. Even if the deposition is 100% conformal, any non-smooth surface due to the protrusion of GST as the result of locally enhanced growth, especially local crystalline growth that is typically faster than the amorphous growth that provides the best conformality, will lead to a "seam" in the GST filled structure where the films on the side walls of the hole or trench meet. This protrusion-like growth is readily formed for GST materials with high levels of crystallization or at low crystallization temperature, which provides a faster phase change alloy for PCM. Furthermore, as desired device performance in terms of smaller reset current and higher speed is realized, the cross section of the hole becomes smaller and the height becomes larger (illustrative hole geometries involving, for example, holes less than 20 nm in diameter or equivalent diameter but with depths of greater than 30 nm). The manufacturing of these hole structures (less than 20 nm) is costly and technologically challenging because it is difficult to fabricate small holes with precision control, and high aspect ratio small holes are difficult to attain for ion etch processes, as ions become difficult to transport into the small and deep holes during the etching process.

For smaller structures of 10 nm diameter, in order to keep the cross-sectional area of the hole variation to about 10%, a 10 nm feature has an approximately 5% diameter variation, which is 0.5 nm and is close to the molecular size of lithography resist. In comparison, maintaining a 30 nm diameter with 10% variation of cross-sectional area requires about 1.5 nm diameter control, which is more readily achieved. The coated GST film thickness on the wall of the hole is controlled by conformal deposition of GST, independent of the lithographic process, and is typically about 1% of the deposition thickness regardless of the absolute thickness of the film, which is very easy to control. Moreover, sufficiently filling smaller holes (whether from starting as a small hole about 5 nm or 10 nm in diameter with dielectric surrounding it, or during the latter stage of GST deposition in filling a hole of 30 to 100 nm, the small holes in these two cases having large aspect ratios) has always been challenging due to problems associated with molecular transport into small and deep holes. The cross-sectional area is $2\pi D \cdot t$, where D is the diameter and t is the thickness, so the thickness is linearly related to the D variation. The hole depth of the PCM device is continually increasing in further device development, adding additional difficulty.

SUMMARY

In one aspect, the present disclosure relates to devices, methods, and processes of conformally depositing GST coatings with thicknesses of less than about 10 nm in holes having diameters of about 30-100 nm. The devices, methods, and processes described herein involve partially filling the hole by coating the sidewall that (at least in part) defines the hole. The remaining portion of the hole is then filled with a conformal deposition of dielectric material at low process temperature (preferably lower than that of GST phase change temperature or at a temperature that will not degrade the deposited GST material's composition and morphology). Exemplary materials include $SiO_2$, $Si_3N_4$ or a similar material having suitable electrical properties, good thermal insulating properties, and mechanical stability during the PCM phase change of the material, especially during the melting process. The filled hole defines a GST structure.

In structures incorporating such a configuration, the cross section of a conducting GST path in the GST structure is effectively caused to have a reduced cross sectional area, which may reduce reset current of PCT devices in which such structures are utilized. Also, filling the structures with $SiO_2$, which has relatively low thermal conductivity due to reduction of cross-sectional area of GST materials, reduces the amount of heat loss in the PCM device and allows the device to operate in a more efficient heating manner.

Furthermore, this approach may alter a GST phase change activity to particular regions. In particular, it may alter the GST phase change activity (1) by moving the phase change region away from the bottom of a filled hole and to the area in between the electrodes, because the reduced cross-sectional area is away from the bottom electrode, as a result of which materials involved in phase change smallest in volume are moved away from the bottom region where the whole electrode area is covered by GST (this may favor growth driven by and based on the phase change process); (2) by making phase change near the bottom electrode, as more GST material is available at the bottom in the "cup" for increasing the probability of nucleation for phase change, which favors a nucleation-based phase change process; (3) if the deposited GST film is less conformal than 100%, which results in the GST sidewall thickness near the bottom being less than that at the upper portion of GST sidewall (which will make the resistivity higher at the thinner GST sidewall region, thereby possibly making it easier to make a phase change at such location).

The control of these three phase change regions provides separate respective advantages and can be favorably utilized in making the optimized devices. Furthermore, reports have shown that GST films in which the film is thinner than 4 nm have faster phase change behaviors as compared with bulk-like GST materials. Thus GST films in which the GST is thinner than 10 nm on the side wall, with 4 nm or less being preferred, allow for faster PCM devices based on GST materials.

In one aspect, the present disclosure relates to a memory cell structure, comprising a substrate having a via therein bound at first and second ends of the via by electrodes, wherein the via is coated on side surfaces thereof with a film of GST material defining a core that is hollow or at least partially filled with material selected from the group consisting of germanium and dielectric materials.

In another aspect, the disclosure relates to a phase change memory including such memory cell structure.

The disclosure in another aspect relates to a method of fabricating a GST memory cell structure in a substrate containing a via closed at one end thereof with a bottom electrode, the method comprising:
conformally coating sidewall surface of the via and surface of the bottom electrode closing the via, with a GST material film, to form an open core volume bounded by the GST material film; annealing the GST material film; and
forming a top electrode at an upper portion of the via.

In a further aspect, the present disclosure relates to a process for manufacturing a dielectric-filled germanium antimony telluride (GST) structure for a phase change memory device, comprising the steps of:
providing a substrate having a hole extending through a first dielectric layer to expose a first electrode which is under the dielectric layer to close a first end of the hole;
partially filling the hole with GST;
depositing another dielectric material into the partially filled hole;
depositing a second electrode at a second end of the hole after planarization; and
removing excess dielectric material and GST over the first dielectric to expose GST as a ring-like GST end for making the contact.

The disclosure in yet another aspect relates to a phase change memory device, comprising:
a substrate;
a hole structure extending from a first surface of the substrate to a second surface of the substrate;
GST deposited on walls defining the hole structure;
a dielectric material deposited on the GST deposited on the walls defining the hole structure; and
first and second electrodes located at opposing ends of the hole structure; wherein a diameter of the hole structure is less than about 30 to 100 nm and wherein the GST is deposited to a thickness of less than about 10 nm.

Other aspects, features and embodiments of the disclosure will be more fully apparent from the ensuing description and appended claims.

BRIEF DESCRIPTION OF THE DRAWINGS

FIG. 1(A-C) is a schematic representation of the filling of a hole in a substrate to define a dielectric-filled GST structure.

FIG. 2(A-C) is a schematic representation of the filling of a hole with a dielectric in which the GST is deposited non-uniformly and in which a void is present in the deposited dielectric material.

FIG. 4(A-C) is a representation of a process flow sequence for a conventional GST process in which GST is deposited in a hole (FIG. 4A) following which the structure is submitted to chemical mechanical planarization (FIG. 4B), with the structure thereafter being annealed and resultantly experiencing shrinking of the GST material in the hole (FIG. 4C).

FIG. 5(A-C) is a representation of a process flow sequence, in which a hollow structure GST coating of floor and side wall surfaces of a hole is carried out, following which annealing of the GST film is carried out to render the GST material crystalline in character (FIG. 5B) with the shrinkage being small due to the low thickness of material in the hole, following which hole may be filled with germanium or other suitable insulating material (FIG. 5C).

DETAILED DESCRIPTION

The present disclosure relates to phase change memory devices incorporating GST materials, in which a hollow GST structure is filled with dielectric, as hereinafter more fully described.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein and in the appended claims, the singular forms "a", "and", and "the" include plural referents unless the context clearly dictates otherwise.

Unless otherwise specified, all film compositions herein are specified in terms of atomic percentages of the film components, wherein the sum of all atomic percentages of all components in the film totals to 100 atomic %.

It will be appreciated that the method and GST structures of the present disclosure can be effectuated in hole structures of widely varying dimensions, and that the ensuing description is directed to illustrative examples and disclosure.

In one embodiment, a 5 nm coating of GST on the sidewall surfaces of a hole that is 30 nm in diameter provides a structure having a conducting path that is similar to that in a hole that is 15 nm in diameter and fully filled with GST. However, the diameter dimensional tolerance percentage for a hole that is 30 nm in diameter is twice that of a hole that is 15 nm in diameter. The cross-sectional area variation in the process of the present disclosure is substantially decreased by the conformal deposition based GST film coating on the side wall. The GST film variation is lithographically independent and can be as small as 1% as a result of which the cross-sectional area accuracy % can be increased. In addition, a 30 nm hole is easier to form than a 15 nm hole by lithography and etch techniques.

Figure 1A:
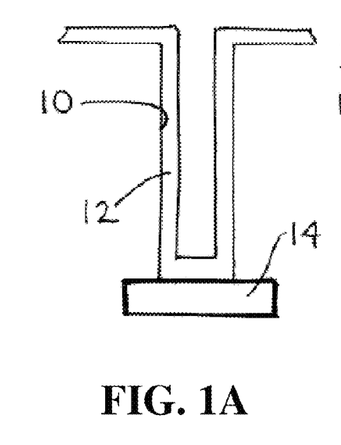
FIG. 1A shows the conformal deposition of GST on the side wall of a small hole whose bottom is in contact with the bottom electrode.

Referring to FIG. 1(A-C), a structure in the form of a hole 10 in a substrate is shown. The hole 10 is about 30 nm in diameter. The bottom of the hole is closed by an electrode 14. A layer 12 of GST is deposited on the substrate and in the hole 10 such that a top surface of the substrate, sidewalls defining the hole, and a surface of the electrode 14 that closes the hole are coated. The GST on the sidewalls is deposited (preferably conformally) to a thickness of less than about 10 nm (and preferably about 5 nm). A hollow GST structure (FIG. 1A) is thereby defined.

Figures 1B, 1C:
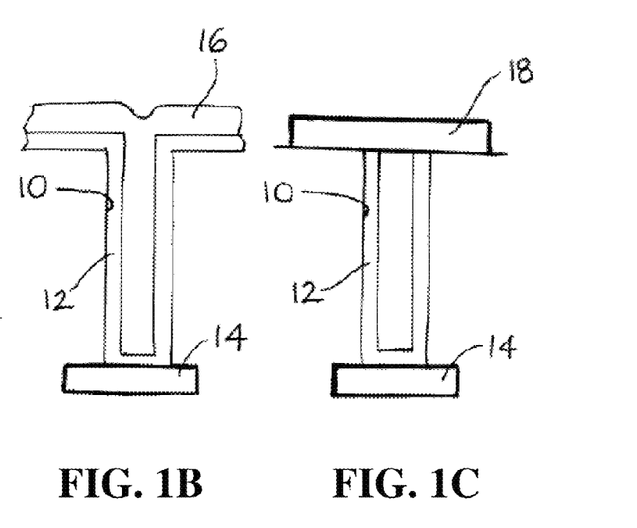
FIG. 1B shows the fill of the hole with $SiO_2$ or other dielectric material.
FIG. 1C shows the structure after chemical mechanical polishing or other method to remove excess GST and $SiO_2$, for planarization of the top horizontal surface of the hole, and with a top electrode formed thereover.

In manufacturing the GST structure, the remaining portion of the structure is then filled with a dielectric 16 such as $SiO_2$ in a low temperature process (the temperature is preferably lower than that of the GST phase change temperature so that the process of dielectric fill will not degrade the composition or amorphous character of GST film). The technique is not limited in this regard, as other insulating materials or materials having low thermal conductivities (e.g., $Si_3N_4$) and sufficient mechanical strength at the GST melting temperature of around 600 degrees C. may be used. In depositing the $SiO_2$, a layer of such material may be deposited over the GST deposited on the top of the substrate (FIG. 1B). A chemical-mechanical polish (CMP) process (or similar method) is then used to remove excess GST and $SiO_2$ on the top of the substrate. In doing so, the GST structure is made level with the top horizontal surface of the hole. A second electrode is then added at the top of the GST structure (FIG. 1C).

Figure 2A:
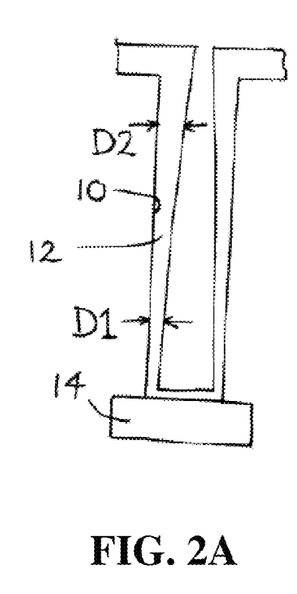
FIG. 2A shows the filling of a via with an incomplete GST fill, wherein the side wall thickness of the GST is greater at the upper portion of the via than at the lower portion thereof.

Referring now to FIG. 2(A-C), an alternate manner of filling a hole with crystalline GST having an atomic weight ratio of about 2:2:5 and a dielectric material is shown. As can be seen in FIG. 2(A), the thickness to which the upper portion of the hole 10 is coated with GST material 12 may be greater than the thickness to which the lower portion of the hole is coated (D1<D2). In doing so, the electrical resistance at the bottom of the hole, in proximity to bottom electrode 14, is greater. Again, after depositing the GST material and before depositing the dielectric, a hollow GST structure is defined.

In filling the hollow GST structure, the hole may not be entirely filled. More specifically, in depositing the $SiO_2$ (or $Si_3N_4$ or other dielectric) material 20 into the hole, voids 22 may be defined. However, as long as the voids 22 are able to sustain temperatures of about 600 degrees C., the filled GST structures may be adequate for their intended purposes.

Figure 2B:
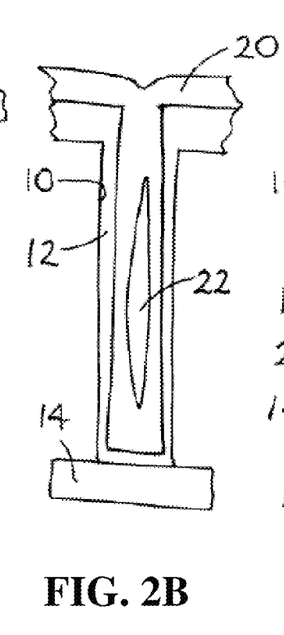
FIG. 2B shows the structure after conformal deposition of an insulating dielectric material, in which the fill has left a void.
Figure 2C:
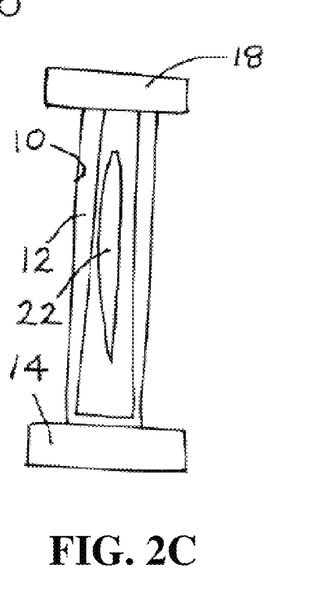
FIG. 2C shows the structure after chemical mechanical planarization and deposition of a top electrode.

After filling the hollow GST structure as shown in FIG. 2B, the $SiO_2$ (or other material) may be polished off in a CMP process, and a second electrode 18 may be deposited (FIG. 2C).

Figure 3:
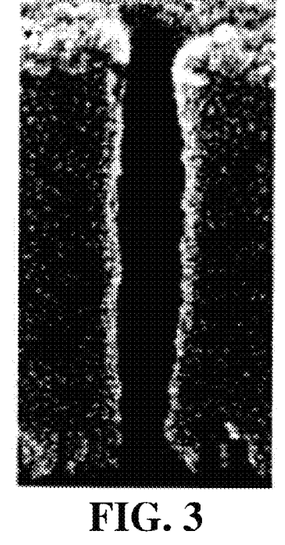
FIG. 3 is a micrograph of a hole in a substrate illustrating the substantially conformal deposition of a film of GST at the sidewall surfaces defining the hole.

Referring to FIG. 3, a micrograph of a hole in a substrate illustrates the substantially conformal deposition of a film of GST at the sidewall surfaces defining the hole, although there is some excess deposition of GST at the entrance of the hole which may lead to void formation if continuous GST deposition is conducted at such entrance, and closes the entrance opening. The GST composition as used in the deposition of the film is about 23% Ge, 21% Sb, and 55% Te.

The above-described manufacturing process enables a high cross-sectional area accuracy to be achieved. Such process may also improve performance of a PCM device by changing the resistivity to a higher value due to reduced cross-sectional enabled by such process, which in turn enables reset current to be reduced. Further, a PCM device having improved speed due to the conformal deposition of a very thin layer of GST material (e.g., less than 4 nm thickness) on the side wall or bottom as the functional material is also attained. In addition, the thermal insulating properties of the $SiO_2$ or other dielectric material used to fill the hole yields a PCM device having improved reliability over devices of the prior art.

In the preceding discussion, the conformal coating of floor and side wall surfaces of the hole was described, with dielectric material thereafter being employed to fill the hole to a fully filled or otherwise predetermined state.

Rather than utilizing dielectric material for remaining fill of the hole subsequent to conformal GST deposition, the conformally coated hole with GST alloy on side and floor surfaces of the hole can be filled with germanium from a suitable Ge precursor to complete the fill of the hole. Germanium is advantageous in such respect, since its melting point is 920° C., which is above temperatures of operation for GST alloys, which are on the order of 600° C. for device switching.

Such residual fill with germanium affords the advantage of process simplification, since the initial flow of germanium, antimony and tellurium precursors can be utilized in the first instance for conformal coating of the floor and side wall surfaces of the hole, following which the antimony and tellurium precursor flows can be terminated so that germanium deposition is continued to fill the cavity that is formed by the initial GST conformal coating of floor and side surfaces of the hole in the substrate. Such approach obviates the need a further tool or processing step for residual filling of the hole with dielectric or other non-GST material. Further, process temperature control is facilitated, by a simple termination of the supply of the Sb and Te precursors, without alteration of the process temperature for or during the further Ge deposition.

Any suitable precursors can be employed for such purpose, such as germanium n-butyl amidinate (GeM) or other suitable germanium precursors that are usefully employed for supplying germanium for formation of germanium-containing films, e.g., germanium telluride films or germanium antimony telluride films. For the GST film formation process employed in the method of the present disclosure, the tellurium precursor may comprise di-t-butyl telluride, and the antimony precursor may comprise tris(dimethylamido) antimony. Any other Ge, Sb and Te precursors can be used, as necessary or desirable in a given application.

By the above-described technique of forming the GST film and then terminating the supply of antimony and tellurium precursors under deposition conditions yielding conformal coating of the side and bottom surfaces of a hole, a germanium-filled GST hollow structure can be formed in a hole in or on the substrate. To avoid infusion of germanium into the GST alloy, the GST material subsequent to deposition thereof may be exposed to oxidation conditions by introducing an oxidizing gas, e.g., oxygen, into the deposition chamber, to form an oxidation barrier layer on the outer surface of the GST material that will effectively isolate the subsequently deposited germanium from the earlier deposited GST alloy.

The conformal deposition of thin film GST alloy material on sidewall and floor surfaces of holes, e.g., via structures, to leave a hollow core structure (empty volume) in the hole has been described above, as permitting fill of the empty volume with another material, such as a dielectric material, or alternatively the empty volume in the hollow core structure of the GST formation can be filled with germanium.

Such hollow core structure has a beneficial character, since in conventional fill operations in which a hole is completely filled with GST alloy, the bulk of the GST material in the hole can shrink significantly during subsequent crystallization (annealing) processing. This shrinkage in turn can delaminate the GST alloy material from the bottom electrode, and this delamination can render the resulting PCM device deficient or even useless for subsequent operational deployment.

By the hollow core structure of the conformally coated GST material on the floor and sidewalls of the hole, the dimensional extent of the GST material that is subject to shrinkage is reduced, for inner surface area to promote atomic movement or relaxation of stress, and since shrinkage itself is proportional to the length scale of the material, shrinkage will be reduced, to correspondingly reduce delamination behavior.

The hollow core structure of the conformally coated GST in the hole also has beneficial character, in respect of the areal extent of contact between the GST alloy material and the bottom electrode, as an active region of the device structure. Specifically, since the GST on material is conformally coated on the bottom electrode surface, the dimensional character of such active region is maximized.

In this respect, the present disclosure also contemplates forming a recess or cavity in the bottom electrode of the PCM device structure, in order to increase the interfacial area between the GST material and the electrode, and thereby increase the extent of the active region of the device structure. For this purpose, an etch operation may be employed to create a recess or cavity in the bottom electrode element, e.g., by over etch during via (hole) formation. In addition to increasing the extent of active area and contact between the GST material and the electrode, such arrangement has an additional advantage of resisting delamination between the GST and electrode. Shrinkage of GST during the crystallization process is strongest along the longitudinal axis of the via (hole). Accordingly, by effecting contact between the GST conformal film and a side surface of a cavity or recess in the bottom electrode, as well as between the GST conformal film and bottom surface of the electrode, better GST/bottom electrode metal contact is secured, and the resulting PCM device structure is correspondingly less susceptible to delamination of the GST film and bottom electrode.

The conformal coating of the side and floor surfaces of the hole has a further advantage, with respect to so-called "pop in" processing, involving initial application of sufficient voltage to melt the GST alloy when poor GST/metal contact is present. Such pop in processing is normally required when significant delamination of the GST at the GST/metal interface has occurred, so that contact between the GST material and the electrode can be reestablished. Nonetheless, the pop in event can be detrimental to device reliability and uniformity among all of the individual GST elements in a PCM array.

Conformal deposition of GST by chemical vapor deposition (CVD) normally produces amorphous GST material. Upon annealing, such material becomes crystalline and exhibits low virgin resistance. The linear shrinkage incident to GST crystallization may be as much as 5%. Such shrinkage is proportional to the length of the GST material, and in GST material of significant length character this shrinkage is responsible for significant interfacial delamination between the GST material and the metal electrode. For example, in a via of 3000Å height, filled with GST, the shrinkage can be as much as 30Å when the linear shrinkage is 1% and the shrinkage is perpendicular to the interface of the GST/metal electrode contact. By utilizing the hollow GST structure of the present disclosure, the shrinkage will be predominately in a direction parallel to the GST/metal electrode interface, having a substantially smaller linear dimension, thereby suppressing delamination behavior. The inner surface area of the hollow or "cup" portion of the film allows better material stress relaxation.

Figure 4A:
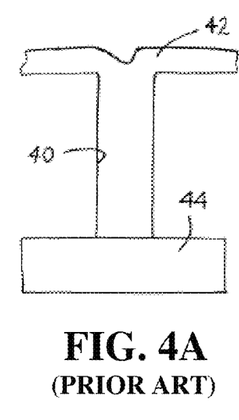
Figure 4B:
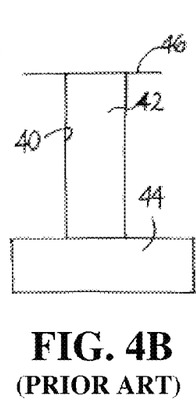
Figure 4C:
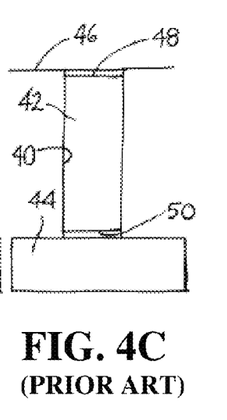

Referring again to the drawings, FIG. 4(A-C) (PRIOR ART) is a representation of a process flow sequence for a conventional GST process in which GST material 42 is deposited in a hole (via) 40 in a substrate including a bottom electrode 44 bounding the hole at its lower end as illustrated (FIG. 4A), following which the structure is subjected to chemical mechanical planarization (FIG. 4B) to form a planar surface 46. Thereafter, the structure is subjected to annealing, which causes shrinking of the GST material 42 in the hole 40, so that the top surface 48 of the GST material is below the level of the planarized surface 46, and the bottom surface 50 is in spaced relationship to the top surface of the bottom electrode 44 (FIG. 4C).

Figure 5A:
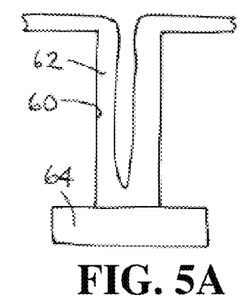
Figure 5B:
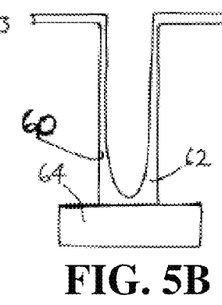
Figure 5C:
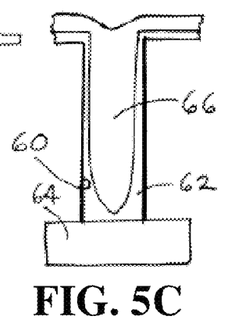

FIG. 5(A-C) is a representation of a process flow sequence, in which a hollow structure GST coating of floor and side wall surfaces of a hole 60 is carried out to form a hollow core structure GST mass 62 in the hole. The hole is bounded at its lower end by electrode 64. Following the initial conformal coating of the floor (defined by the top surface of electrode 64) and side surfaces of the hole, annealing of the GST film is carried out to render the GST material crystalline in character (FIG. 5B), with the shrinkage of the GST material being small due to the low thickness of material in the hole Finally, the hole 60 is filled with germanium or other suitable material 66 (FIG. 5C).

Figure 6:
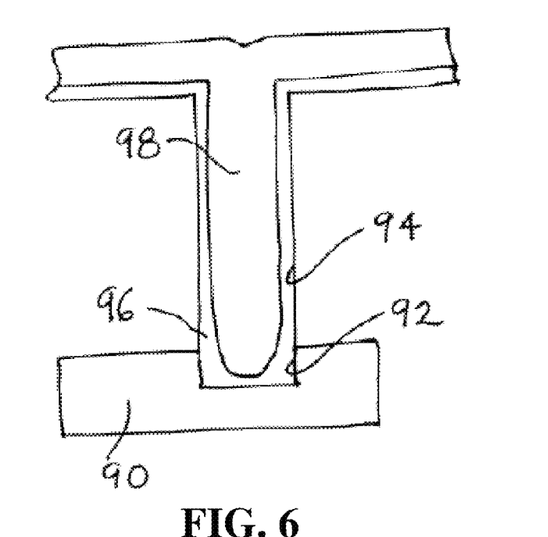
FIG. 6 is a schematic representation of a via structure, in which the bottom electrode has been fabricated to have a recess therein, to increase GST/bottom electrode interfacial contact area, and wherein the thin film conformal coating of the bottom electrode floor and side surface and main via side surfaces defines a hollow core structure that has been filled with a dielectric material, germanium, or other suitable insulating material.

FIG. 6 is a schematic representation of a via structure, in which the bottom electrode has been fabricated to have a recess therein, to increase GST/bottom electrode interfacial contact area, and wherein the thin film conformal coating of the bottom electrode floor and side surface and main via side surfaces defines a hollow core structure that has been filled with a dielectric material, germanium, or other suitable material.

In the FIG. 6 structure, which may be part of a PCM memory structure, the GST material 96 has been conformally deposited on the side surfaces of a via 94 that extends into a bottom electrode 90 that has been over etched to form a cavity 92 therein. The side surface and floor surface of the cavity therefore define and bound the lower portion of the via. The GST material 96 has been conformally deposited in the via to form a hollow core void volume in the interior of the via. In this hollow core void volume is deposited in a germanium fill material 98, after the hollow core void volume surface has been oxidized by exposure to an oxic atmosphere, to form an oxide barrier layer on the outer surface of the GST material, and thereby prevent diffusion of the germanium into the GST alloy.

Alternatively, or additionally, a film of Ge or other material such as Si can be deposited on the hollow core void volume surface of the GST material and then oxidized to provide an oxide barrier layer on the outer surface of the GST material. For such purpose, Ge may be deposited as a porous film, which in exposure to an oxic atmosphere will form a $GeO_x$ oxide layer. Silicon may be correspondingly deposited in a thin film that thereafter is exposed to an oxic atmosphere to form an $SiO_x$ oxide layer.

The present disclosure contemplates a variety of fill structures in the hole in which GST material is deposited to form a hollow core conformation. In one fill structure arrangement, the GST material is deposited so as to form a hollow core void volume therein. In another fill structure arrangement, the hollow core defined by the deposited GST material on the sidewall and floor surfaces of the hole is at least partially filled with germanium. A further fill structure arrangement involves the hollow core defined by the deposited GST material on the sidewall and floor surfaces of the hole being at least partially filled with a dielectric material, such as silicon dioxide or silicon nitride. In another fill structure arrangement, the GST material film defining the core has an oxide on an exterior surface thereof. The oxide may comprise a GST alloy oxide. The core volume bounded by such GST alloy oxide can be at least partially filled with germanium, e.g., with such germanium having an oxidized exterior surface resulting from exposure to an oxic ambient. Alternatively, the core volume bounded by such GST alloy oxide can be at least partially filled with a dielectric material, such as a silicon dioxide or silicon nitride dielectric material. As a still further alternative, the GST material film defining the core has silicon dioxide or germanium oxide on an exterior surface thereof, and the core volume bounded by such silicon dioxide or germanium oxide can be at least partially filled with germanium, or with a dielectric material such as silicon dioxide or silicon nitride, with all permutations of such core-filling materials being contemplated. When the core volume is filled with germanium, the exterior surface of such germanium will invariably be oxidized to $GeO_x$ upon exposure to an oxic ambient. The formation on the GST material surface of a silicon dioxide film can be effected by depositing silicon on the GST material exterior surface in the first instance, followed by oxidation of the silicon film to yield a silicon dioxide layer on the GST material.

Figure 7:
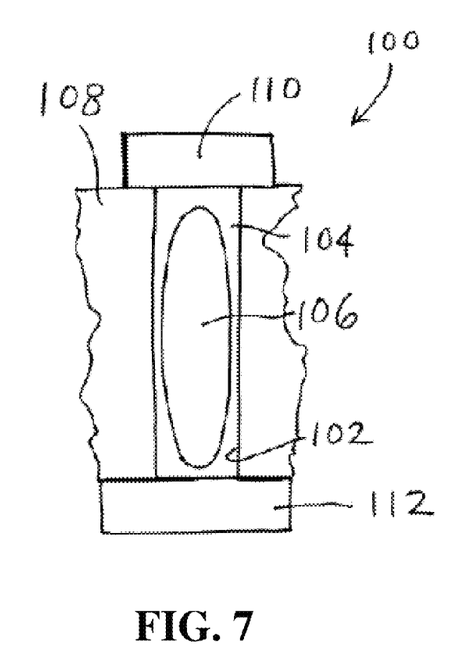
FIG. 7 is a schematic representation of a PCM memory structure, in which GST material has been conformal the deposited to form a hollow core void volume in the interior of a via, with the GST material in contact at respective ends of the via with electrode elements.

FIG. 7 is a schematic representation of a PCM memory structure 100, in which GST material 104 has been conformally deposited to form a hollow core void volume 106 in the interior of a via 102 in the substrate 108, with the GST material 104 in contact at respective ends of the via with electrode elements 110 and 112.

In this FIG. 7 structure, the void volume is of such size as to minimize the amount of GST material that is required to be introduced to the via.

It will be recognized from the foregoing that the various arrangements of the present disclosure enable continuous interfacial contact to be realized, between the GST material, and the bottom electrode, and that hollow core or filled hollow core structures can be provided in holes of PCM device substrates, to form uniform high-performance arrays of PCM cells in a ready manner. It will also be recognized that the vapor deposition process used to conformally coat side and bottom surfaces of holes with GST material can be carried out in any suitable manner, with respect to process conditions therefor, such as temperatures, pressures, flow rates and compositions of GST precursors, and temperature and pressure conditions in the deposition chamber in which the GST material is formed in the substrate holes. Such process conditions can be determined, within the skill of the art, based on the disclosure herein, by empirical determinations in which process conditions are selectively varied and the resulting deposited material and structures containing the same are characterized as to the conformation and performance up the resulting PCM cell structures.

It will be further recognized that individual features described herein in specific embodiments may be combined with one or more features of other embodiments as specifically described herein, in various implementations of the disclosure, with all such permutations being contemplated as being within the scope of application of the description herein.

In a specific implementation, the disclosure relates to a memory cell structure, comprising a substrate having a via therein bound at first and second ends of the via by electrodes, wherein the via is coated on side surfaces thereof with a film of GST material defining a core that is hollow or at least partially filled with material selected from the group consisting of germanium and dielectric materials.

In such memory cell structure, the core can be hollow, or at least partially filled with germanium, silicon dioxide, silicon nitride, or other dielectric material.

The memory cell structure can be formed so that surface of at least one of the electrodes bounding the via is coated with the film of GST material. The film of GST material can be from 4 nm to 10 nm in thickness. The via may have a diameter of from 15 to 100 nm. The GST material may have atomic weight ratio of about 2:2:5.

A phase change memory may be formed including a memory cell structure as described above.

The disclosure in another aspect, contemplates a method of fabricating a GST memory cell structure in a substrate containing a via closed at one end thereof with a bottom electrode, the method comprising:
conformally coating sidewall surface of the via and surface of the bottom electrode closing the via, with a GST material film, to form an open core volume bounded by the GST material film; annealing the GST material film; and
forming a top electrode at an upper portion of the via.

In one embodiment of such method, the open core volume form by such conformally coating defines a void in the GST memory cell structure after the top electrode is formed at the upper portion of the via.

The method may be carried out, further comprising at least partially filling the open core volume prior to forming the top electrode, with a material selected from the group consisting of germanium and dielectric materials. Such filling material may comprise germanium, silicon dioxide, silicon nitride, or other suitable fill material.

The disclosure contemplates in another aspect a process for manufacturing a dielectric-filled germanium antimony telluride (GST) structure for a phase change memory device, comprising the steps of:
providing a substrate having a hole extending through a first dielectric layer to expose a first electrode which is under the dielectric layer to close a first end of the hole;
partially filling the hole with GST;
depositing another dielectric material into the partially filled hole;
depositing a second electrode at a second end of the hole after planarization; and
removing excess dielectric material and GST over the first dielectric to expose GST as a ring-like GST end for making the contact.

Such process may be carried out in which step of partially filling the hole with GST comprises depositing GST on surfaces defining the hole and on the first electrode closing the hole. The step of depositing GST may comprise depositing GST to a thickness of less than about 10 nm, e.g., a thickness of about 4 nm to about 10 nm. In various embodiments, the hole may be less than about 30 to 100 nm in diameter. The process may comprise forming a void in the dielectric material deposited into the partially filled hole. The process may further comprise using the publishing process to remove excess GST and dielectric material at the second end of the hole to form the ring-like GST end prior to depositing the second electrode.

The disclosure in another aspect relates to a phase change memory device, comprising:
a substrate;
a hole structure extending from a first surface of the substrate to a second surface of the substrate;
GST deposited on walls defining the hole structure;
a dielectric material deposited on the GST deposited on the walls defining the hole structure; and
first and second electrodes located at opposing ends of the hole structure; wherein a diameter of the hole structure is less than about 30 to 100 nm and wherein the GST is deposited to a thickness of less than about 10 nm.

Such phase change memory device in various embodiments can comprise at least one void formed in the dielectric material. The dielectric material may be selected from the group consisting of $SiO_2$ and $Si_3N_4$. The GST may be present in any suitable stoichiometric form. In some of the various embodiments contemplated by the present disclosure, the GST phase change material comprises from 10-50 atomic % Ge, from 1-70 atomic % Sb, and from 20-90 atomic % Te, with the atomic percentage amounts of such Ge, Sb and Te components totaling to 100 atomic %.

Among others of the various GST materials contemplated by the disclosure for use in memory cell structures, GST materials can be used that have the formula $Ge_xSb_yTe_zA_m$, in which A is one or more dopant species selected from the group consisting of N, C, In, Sn, and Se. The source of the elements N and C may be either the precursors of Ge, Sb, or Te, e.g., in organometallic precursors for such elements, in which the precursor includes a N— and/or C— containing moiety that serves to introduce nitrogen and/or carbon to the deposition for incorporation in the film being formed; alternatively, the source of the nitrogen and/or carbon can be additional precursors or added co-reactants. The nitrogen and/or carbon may be introduced to the deposition for incorporation in the film being formed, in a free form or in a bound, e.g., covalently bonded, form. As an example, the nitrogen component may be introduced to the deposition in free form, as nitrogen gas, or nitrogen can be introduced by addition of a nitrogenous component to the deposition, such as ammonia, urea, or other nitrogen-containing compound.

In $Ge_xSb_yTe_zA_m$ films useful for such memory cell structures, x, y, z and m can have any suitable and compatible values. In various embodiments, x is about 0.1-0.6, y is about 0-0.7, z is about 0.2-0.9, and m is about 0-0.20. As mentioned, the dopant A can include more than one compatible dopant element from the group of dopant elements N, C, In, Sn, and Se, so that $A_m$ comprises multiple $A_m$ dopant elements. For example, the dopant elements can be carbon and nitrogen in the GST film, as respective $A_m^1$ and $A_m^2$ constituents of the aforementioned formula, wherein each of the $A_m^1$ and $A_m^2$ constituents is independently defined as to its amount in the GST alloy composition by m having a value of from 0 to 0.20.

In various preferred embodiments, the GST alloy material used in the phase change memory structures of the present disclosure may be selected from among the following materials:

(i) material of the formula $Ge_xSb_yTe_zC_mN_n$
wherein:
x is about 0.1-0.6, y is about 0-0.7, z is about 0.2-0.9, m is about 0.02-0.20, and n is about 0.02-0.20;
(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;
(iii) material containing 27.5 to 33% germanium, with tellurium up to 55%, and the remainder being antimony;
(iv) 225 GeSbTe doped with germanium to yield germanium-rich GeSbTe material;
(v) germanium-enriched GeSbTe having a ratio of GeTe:$Sb_2Te_3$ that is in a range of from 3:1 to 10:1;
(vi) GeSbTe material containing 25 to 60% germanium, 8 to 25% antimony, and 40 to 55% tellurium; and
(vii) material selected from the group consisting of materials (ii)-(vi), as doped with at least one of carbon and nitrogen, wherein the amount of each is in a range of from 2 to 20%.

The materials of the above-described type can include material in which $Ge_xSb_yTe_z$ therein has an atomic composition selected from the group consisting of:

(i) 22.5 at. % germanium, 22.5 at. % antimony and 55 at. % tellurium;
(ii) 27.5 to 32.5 at. % germanium and from 50 to 55 at. % tellurium;
(iii) 27 to 33% germanium, from 14 to 23% antimony and from 50 to 55% tellurium;
(iv) 27.2% germanium, 18.2% antimony and 54.5% tellurium;
(v) 30.7% germanium, 15.4% antimony, and 53.9% tellurium;
(vi) 33.3% germanium, 13.3% antimony and 53.3% tellurium;
(vii) 35.3% germanium, 11.8% antimony and 52.9% tellurium;
(viii) 36% germanium, 14% antimony and 50% tellurium;
(ix) 40% germanium, 8% antimony and 52% tellurium;
(x)) 40% germanium, 5% antimony and 55% tellurium;
(xi) 30% germanium, 19% antimony and 51% tellurium;
(xii) 30% germanium, 16% antimony and 54% tellurium; and
(xiii) 32% germanium, 14% antimony and 54% tellurium.

The GST alloy material when doped with carbon and/or nitrogen can be doped at any suitable dopant concentration levels. In various specific embodiments, the GST material can be doped with carbon at 2 to 20 at. %, or at 3 to 20 at. %, or at 2 to 15 at. %, or at 2 to 10 at. %, or at 3 to 10 at. %, or at 2 to 6 at. %. Likewise, the GST material can be doped with nitrogen at 2 to 20 at. %, or at 3 to 20 at. %, or at 3 to 15 at. %, or at 3 to 12 at. %, or at 3 to 10 at. %, or at 5 to 10 at. %. The specific dopant levels can be readily determined within the skill of the art, based on the present disclosure, by conducting doping at varying levels and characterizing the resulting doped GST films as to their characteristics and performance qualities.

The PCM structures of the present disclosure can be formed with deposition of the GST material by vapor deposition processes of suitable character that employ appropriate precursors for the respective Ge, Sb and Te components of the GST material. Exemplary precursors include, but are not limited to, germanium n-butylamidinate (germanium precursor), tris(dimethylamido)antimony (antimony precursor), and diterbutyltelluride (tellurium precursor).

The vapor deposition of the GST material can be carried out by chemical vapor deposition (CVD) techniques, including for example atmospheric pressure CVD (APCVD), low pressure CVD (LPCVD), ultrahigh vacuum CVD (UHVCVD), aerosol-assisted CVD (AACVD), digital CVD (DCVD), direct liquid injection CVD (DLICVD), microwave plasma-assisted CVD (MPCVD), plasma-enhanced CVD (PECVD), remote plasma-enhanced CVD (RPECVD), atomic layer CVD (ALCVD), hot wire CVD (HWCVD), metalorganic chemical vapor deposition (MOCVD), hybrid physical-chemical vapor deposition (HPCVD), rapid thermal CVD (RTCVD), and vapor phase epitaxy (VPE), using appropriately determined or selected CVD process parameters, e.g., as empirically determined by iterative multivariable change of process conditions, and characterization of the resulting GST films. Alternatively, the vapor deposition of the GST material can be carried out by atomic layer deposition (ALD) techniques, using ALD process parameters, e.g., pulse times, cycle durations, temperatures, pressures, volumetric flow rates, etc. that can be correspondingly determined by simple successive empirical runs in which process parameters are selectively varied to determine the best multivariable process envelope for conducting the ALD vapor deposition process to produce desired conformality of coating and character of resulting GST films.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A memory cell structure, comprising a substrate having a via therein bound at first and second ends of the via by electrodes, wherein the via is coated on side surfaces thereof with a film of GST material defining a core that is hollow or at least partially filled with material selected from the group consisting of germanium and dielectric materials, wherein, when the core is hollow or at least partially filled with material selected from dielectric materials, the GST material defining the core has a GST alloy oxide or germanium oxide on an exterior surface thereof.

2. The memory cell structure of claim 1, wherein the core is hollow.

3. The memory cell structure of claim 1, wherein the core is at least partially filled with germanium.

4. The memory cell structure of claim 1, wherein the core is at least partially filled with a dielectric material.

5. The memory cell structure of claim 4, wherein the dielectric material comprises a silicon dioxide dielectric material.

6. The memory cell structure of claim 4, wherein the dielectric material comprises a silicon nitride dielectric material.

7. The memory cell structure of claim 1, wherein the GST material film defining the core has an oxide on an exterior surface thereof.

8. The memory cell structure of claim 7, wherein the oxide comprises a GST alloy oxide.

9. The memory cell structure of claim 8, wherein the core is at least partially filled with germanium.

10. The memory cell structure of claim 9, wherein the germanium at least partially filling the core has an oxidized exterior surface.

11. The memory cell structure of claim 8, wherein the core is at least partially filled with a dielectric material.

12. The memory cell structure of claim 11, wherein the dielectric material is silicon dioxide or silicon nitride.

13. The memory cell structure of claim 7, wherein the oxide comprises germanium oxide or silicon dioxide.

14. The memory cell structure of claim 13, wherein the core is at least partially filled with germanium.

15. The memory cell structure of claim 14, wherein the germanium at least partially filling the core has an oxidized exterior surface.

16. The memory cell structure of claim 13, wherein the core is at least partially filled with a dielectric material.

17. The memory cell structure of claim 16, wherein the dielectric material is silicon dioxide or silicon nitride.

18. The memory cell structure of claim 1, wherein surface of at least one of the electrodes bounding the via is coated with the film of GST material.

19. The memory cell structure of claim 1, wherein the film of GST material is from 4 nm to 10 nm in thickness.

20. The memory cell structure of claim 1, wherein the via has a diameter of from 15 to 100 nm.

21. The memory cell structure of claim 1, wherein the GST material is selected from the group consisting of:
(i) material of the formula $Ge_xSb_yTe_zC_mN_n$ wherein:
x is about 0.1-0.6, y is about 0-0.7, z is about 0.2-0.9, m is about 0.02-0.20, and n is about 0.02-0.20;
(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;
(iii) material containing 27.5 to 33% germanium, with tellurium up to 55%, and the remainder being antimony;
(iv) 225 GeSbTe doped with germanium to yield germanium-rich GeSbTe material;
(v) germanium-enriched GeSbTe having a ratio of GeTe:$Sb_2Te_3$ that is in a range of from 3:1 to 10:1;
(vi) GeSbTe material containing 25 to 60% germanium, 8 to 25% antimony, and 40 to 55% tellurium; and
(vii) material selected from the group consisting of materials (ii)-(vi), as doped with at least one of carbon and nitrogen, wherein the amount of each is in a range of from 2 to 20%.

22. The memory cell structure of claim 1, wherein the GST material has an atomic weight ratio of about 2:2:5.

23. A phase change memory comprising at least one memory cell structure of claim 1.

24. A phase change memory device, comprising:
a substrate;
a hole structure extending from a first surface of the substrate to a second surface of the substrate;
GST deposited on walls defining the hole structure;
a dielectric material deposited on the GST deposited on the walls defining the hole structure; and
first and second electrodes located at opposing ends of the hole structure; wherein a diameter of the hole structure is less than about 30 to 100 nm, wherein the GST is deposited to a thickness of less than about 10 nm, and wherein the GST deposited on walls defining the hole structure has a GST alloy oxide or germanium oxide on an exterior surface thereof.

25. The phase change memory device of claim 24, further comprising at least one void formed in the dielectric material.

26. The phase change memory device of claim 24, wherein the dielectric material is selected from the group consisting of $SiO_2$ and $Si_3N_4$.

27. The phase change memory device of claim 24, wherein the GST comprises from 10-50% Ge, from 1-70% Sb, and from 20-90% Te.

* * * * *